(12) United States Patent
Rytting et al.

(10) Patent No.: US 7,684,447 B2
(45) Date of Patent: Mar. 23, 2010

(54) SEQUENCER AND METHOD FOR SEQUENCING

(75) Inventors: Michael Rytting, Colorado Springs, CO (US); Glenn Wood, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 1487 days.

(21) Appl. No.: 11/022,252

(22) Filed: Dec. 23, 2004

(65) Prior Publication Data

US 2006/0153195 A1 Jul. 13, 2006

(51) Int. Cl.
*H04J 3/04* (2006.01)
*G06F 11/00* (2006.01)

(52) U.S. Cl. .............. 370/535; 370/352; 370/389; 370/536; 370/539; 370/542; 714/24; 714/30; 714/45; 714/47; 714/49

(58) Field of Classification Search ......... 370/352–546; 714/24–49
See application file for complete search history.

(56) References Cited

U.S. PATENT DOCUMENTS

| 4,641,348 | A  | * | 2/1987  | Neuder et al. ........... 382/100 |
| 4,985,825 | A  | * | 1/1991  | Webb et al. ............. 711/169 |
| 5,335,253 | A  |   | 8/1994  | Oliver et al. |
| 6,094,729 | A  | * | 7/2000  | Mann ..................... 714/25 |
| 6,105,087 | A  |   | 8/2000  | Rivoir |
| 6,247,147 | B1 | * | 6/2001  | Beenstra et al. .......... 714/39 |
| 6,256,753 | B1 | * | 7/2001  | Williams ................. 714/47 |
| 6,486,809 | B1 |   | 11/2002 | Figoli |
| 6,615,370 | B1 | * | 9/2003  | Edwards et al. .......... 714/45 |
| 6,725,442 | B1 |   | 4/2004  | Cote et al. |
| 6,732,307 | B1 | * | 5/2004  | Edwards ................. 714/724 |
| 6,760,867 | B2 | * | 7/2004  | Floyd et al. ............. 714/39 |
| 6,836,743 | B1 | * | 12/2004 | Blackham et al. ........ 702/107 |
| 6,918,065 | B1 | * | 7/2005  | Edwards et al. .......... 714/45 |
| 7,055,070 | B1 | * | 5/2006  | Uhler et al. ............. 714/45 |
| 7,080,283 | B1 | * | 7/2006  | Songer et al. ........... 714/30 |
| 7,280,643 | B2 | * | 10/2007 | Howard et al. .......... 379/93.37 |
| 7,325,168 | B2 | * | 1/2008  | Bradley et al. .......... 714/45 |
| 2004/0153877 | A1 | * | 8/2004 | Agarwala ............... 714/48 |

FOREIGN PATENT DOCUMENTS

| GB | 2 233 102 A  |   | 2/1991  |
| GB | 2422460 A    | * | 12/2005 |
| JP | 2006178970 A | * | 11/2006 |

\* cited by examiner

*Primary Examiner*—Ayaz R Sheikh
*Assistant Examiner*—Venkatesh Haliyur

(57) ABSTRACT

A method and apparatus for sequencing determines possible next states for respective possible previous states based upon resources, selects one of the possible next states as an actual next state based upon an actual previous state, and communicates the actual next state as the actual previous state.

20 Claims, 9 Drawing Sheets

SEQUENCER AND METHOD FOR SEQUENCING

BACKGROUND

Logic analyzers in use today function by observing multiple channels' incoming digital data and performing a data storage function based upon bit patterns identified in the incoming data. The intelligence of the logic analyzer lies in its sequencer, which observes the incoming data signals, and produces signaling based upon the incoming data patterns. The signaling is typically a set of output signals that direct other areas of the logic analyzer to perform functions. A user is able to designate those functions performed and what input patterns cause the designated functions to be performed. The sequencer of the logic analyzer is a programmable state machine that makes decisions based upon patterns in the incoming data. One method of implementing a state machine is to provide a look up table (herein "LUT"). As such, the LUT accepts a current state of the sequencer and the incoming data as inputs that provides output indicating a new state of the sequencer and signaling destined to initiate performance of designated functions. Ideally, the sequencer operates at the speed of the incoming data. As data speeds and number of channels increase, however, it becomes more difficult to provide a sequencer fast enough to accommodate the incoming data.

One method for addressing the data speed challenge is to de-multiplex the incoming data to a more manageable speed for the LUT. For each de-multiplex factor, however, memory requirements to implement the sequencer increase geometrically and the solution quickly becomes prohibitively costly. Additionally, it takes more time to process de-multiplexed data through the sequencer and at some point, the benefits gained through de-multiplexing are lost due to increased processing time. Another method is to cascade the LUTs to reduce the memory requirements. Disadvantageously, however, each LUT and interconnecting logic must still operate at the speed of the incoming data. Incoming digital data speeds are currently at 2 GHz and increasing. Using current technology, cascaded LUTs are not able to operate at that speed.

There is a need, therefore, to provide a sequencer that can operate at speed for incoming digital data with an opportunity for improved speeds as technology progresses.

BRIEF DESCRIPTION OF THE DRAWINGS

An understanding of the present teachings can be gained from the following detailed description, taken in conjunction with the accompanying drawings of which.

DETAILED DESCRIPTION

Figure 1:
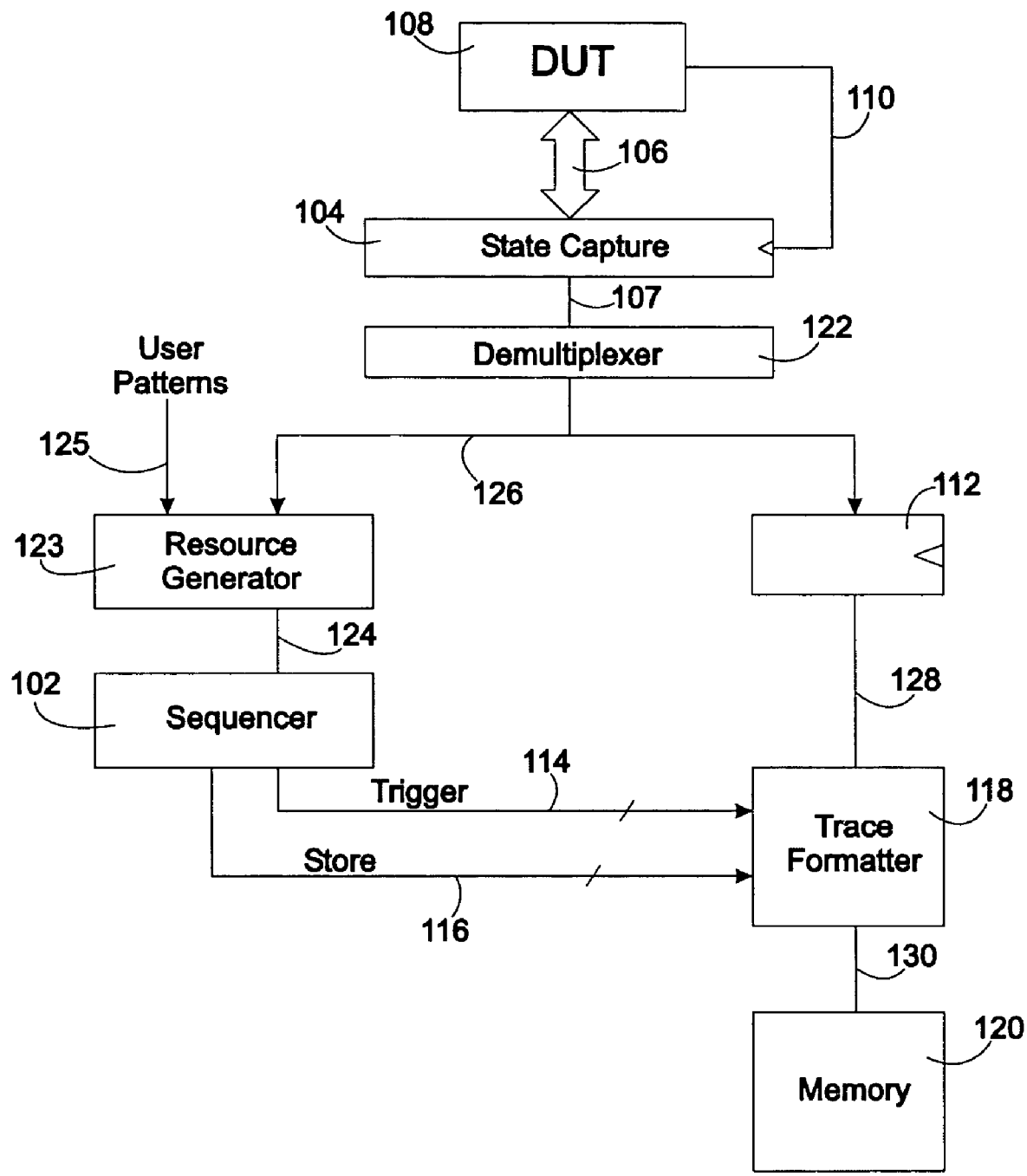
FIG. 1 is a block diagram of a logic analyzer.

With specific reference to FIG. 1 there is shown basic building blocks of a logic analyzer including sequencer 102 according to the teachings of the present invention. The logic analyzer accepts incoming digital data 106 from DUT 108, which is latched into state capture register 104 by DUT clock 110. De-multiplexer 122 accepts capture register output 107 and de-multiplexes it 8 to 1 for simultaneous presentation of the de-multiplexed data 126 to resource generator 123 and latency matching register 112. The resource generator 123 accepts the de-multiplexed data 126 and compares it against patterns 125 established by a user. Results of the pattern matches within the resource generator 123 generate resources 124. Because the resources 124 are de-multiplexed, further data processing is able to proceed at a slower speed than the incoming data rate. The sequencer 102 accepts the resources 124, and generates one or more control signals 114, 116 for data storage. The control signals 114, 116 from the sequencer 102, referred to as trigger 114 and store 116, are connected to trace formatter 118. The trace formatter 118 accepts an output 128 of the latency matching register 112 and selectively stores one or more cycles of the incoming digital data patterns 130 in memory 120 for eventual presentation to a logic analyzer user. In a specific embodiment, the trigger control signal 114 anchors the logic analyzer measurement in time. The store control signal 116 controls whether any one cycle of digital data is stored in the memory 120.

Figure 2:
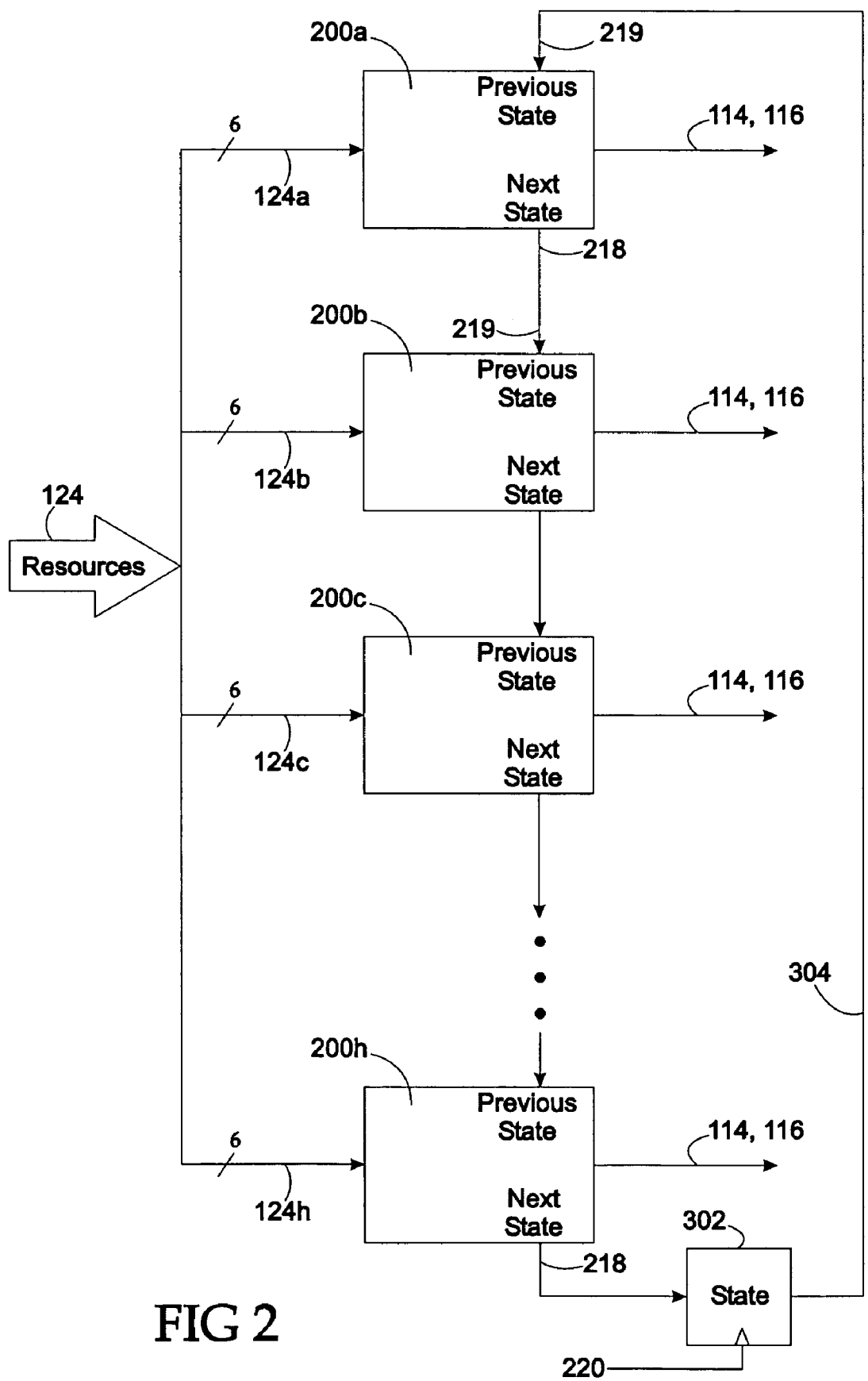
FIG. 2 is a circuit diagram of a sequencer according to the present teachings.

With specific reference to FIG. 2 of the drawings, there is shown a first embodiment of a sequencer 102 according to the present teachings comprising a plurality of sequencing elements 200. In a specific embodiment, the de-multiplexer 122 de-multiplexes the output of the state capture register 104 8 to 1. Other embodiments may have a different de-multiplexing multiple. Because of the 8 to 1 multiplexing in the specific embodiment, there is one resource cycle for every 8 cycles of incoming data 106. In the specific embodiment that uses the 8 to 1 de-multiplexing, there are eight sequencing elements 200, one sequencing element that processes each data cycle. The sequencing elements 200 are connected in a cascaded combination interconnected by actual next state 218 and actual previous state 219 signals. The actual next state output 218 from a first one of the sequencing elements 200a becomes the actual previous state input 219 of a second one of the sequencing elements 200b. All sequencing elements 200 are similarly interconnected. The actual next state 218 of the $8^{th}$ sequencing element 200h is latched into state latch 302. An output of the state latch 304 is connected to the actual previous state input 219 of the $1^{st}$ sequencing element 200a. Accordingly, the actual next state 218 of a last one of the sequencing elements 200h informs the first one of the sequencing elements 200a in a next resource cycle. The sequencing elements 200, therefore, have 8 cycles of the incoming data to properly process a current resource cycle before receiving a next resource cycle. Each sequencing element 200 generates the store and trigger control signals 114, 116 for presentation to the trace formatter 118. The data path through the latency matching register 112 and trace formatter 118 is similarly de-multiplexed and proceeds in parallel with processing that proceeds in the sequencer 102. From a timing perspective, the control signals 114, 116 from the first sequencing element 200b relate to control of the first cycle of every 8 cycles of the incoming data 106, control signals 114, 116 from the second sequencing element 200b relate to control of the second cycle of every 8 cycles of the incoming data 106, and the control signals 114, 116 from the eighth sequencing element 200h relate to control of the last cycle of every 8 cycles of the incoming data 106. In a specific embodiment, therefore, there are 8 store control signals 114 and 8 trigger control signals 116 that are received by the trace formatter 118.

Figure 3:
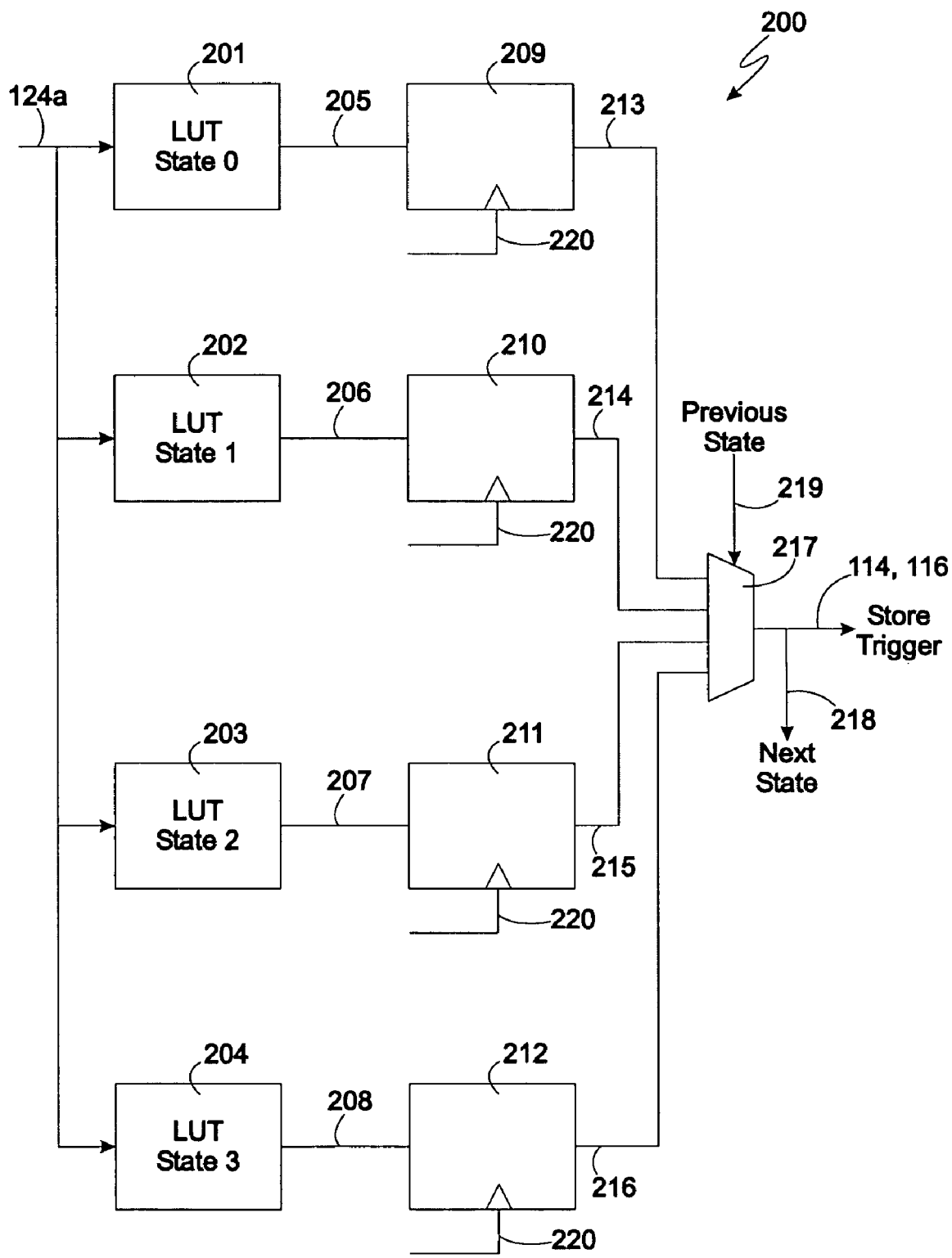
FIG. 3 is a circuit diagram of sequencing element according to the present teachings.

With specific reference to FIG. 3 of the drawings, there is shown an embodiment of the first sequencing element 200a according to the present teachings in which there are four memories that function as respective first, second, third and fourth look up tables 201-204, respectively. Each look up table 201-204 is configured to determine a next possible state 205-208 for each one of four possible previous states based upon its inputs 124a. The first look up table 201 determines the next possible state 205 based upon the inputs 124a assuming the previous actual state is state0, the second look up table 202 determines the next possible state 206 based upon the same inputs 124a assuming the previous actual state is state1, the third look up table 203 determines the next possible state 207 based upon the same inputs 124a assuming the previous actual state is state2, and the fourth look up table 204 determines the next possible state 208 based upon the same inputs 124a assuming the previous actual state is state3. The illustrative example discusses a 4-state state machine. Alternative embodiments of the sequencing element for a state machine with more than four states may have additional look up tables to accommodate the additional states. Each look up table 201-204 accepts as its input 124a, a subset of the resources 124. As the resources subset 124a is presented to the look up tables 201-204, the respective possible next states 205-208 are presented at the output of the look up tables 201-204. Because the sequencer of the present teachings is a state machine, an actual next state is based upon the incoming data 106 as well as an actual previous state. The multiple next state determinations provide a conditional next state for all previous state possibilities and at the look up table processing stage, are independent of the actual previous state 219. The possible next states 205-208 are latched into first, second, third, and fourth sequencer registers 209-212. The sequencing element clocking signal 220 for the first through fourth sequencing registers 209-212 comprises a derivative of the DUT clock 110. In the embodiment with 8 to 1 de-multiplexing, the clocking signal 220 is synchronized with and is $\frac{1}{8}^{th}$ the frequency of the DUT clock 110. An output 213-216 of each sequencer register 209-212 reflects each one of the next possible states 205-208 and is presented to sequencer multiplexer 217. The sequencer multiplexer 217, with all possible next states available to it, selects an actual next state 218 among the next possible states 205-208 based upon an actual previous state 219. Advantageously, determination of the possible next states 205-208 is able to occur before or in parallel with the determination of the actual previous state 219. Final determination of the actual next state 218, therefore, is a matter of multiplexer selection, which is a faster process than the look up table operation. The output of the look up tables 205-208 also include values for the trigger 114 and store 116 control signals relative to the subset of resources 124a being processed. Each sequencing element 200 in FIG. 2 has the structure of the sequencing element shown in FIG. 3. As the actual next state 218 from the first resource subset 124a is determined by the first sequencing element 200a, it is presented as the actual previous state to the second sequencing element 200b. The sequencer multiplexer 217 of the second sequencing element 200b then is able to make its selection of the actual next state 218 from the second resource subset 124b and presents it to the third sequencing element 200c. Accordingly, the actual next states 218 ripple through the sequencing elements 200a through 200h. Because all possible next states are already available to the sequencer multiplexers 217, determination of the actual next states 218 are able to ripple through very rapidly. As the $8^{th}$ sequencing element 200h makes its determination, all resources 124 of the present resource cycle are processed. The actual next state 219 of the $8^{th}$ sequencing element 200h from a last resource cycle is then stored into the state latch 302. The actual previous state 219 for a next sequencing cycle, therefore, is maintained at the state latch output 304 in preparation for the next resource cycle. As one of ordinary skill in the art appreciates from a review of FIGS. 2 and 3, the look up table processing for each resource subset 124a through 124h occurs in parallel and provides each of the sequencer multiplexers 217 with all possible next states at the respective inputs 213 through 216.

Figure 4:
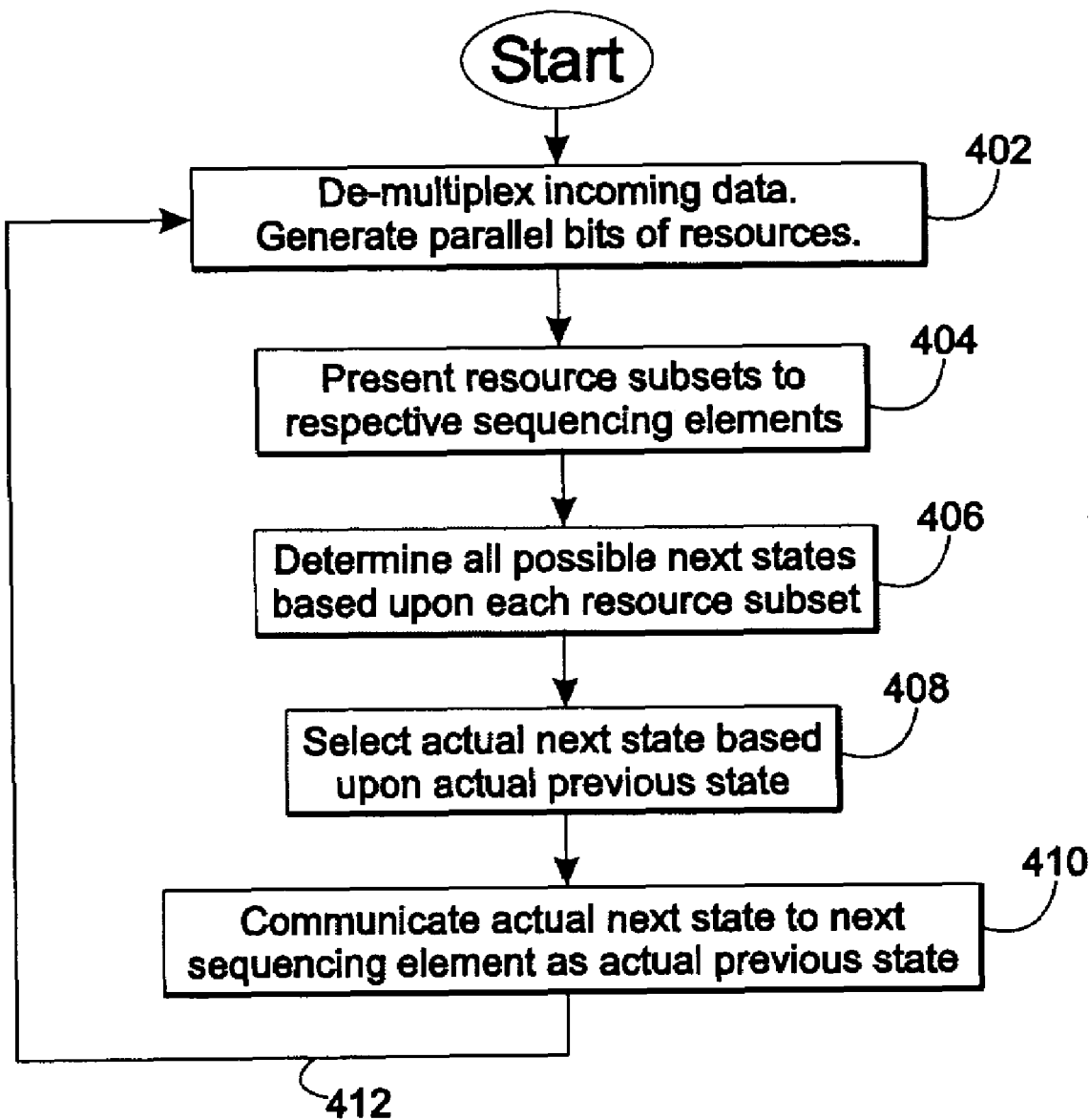
FIG. 4 is a flow chart of a process according to the present teachings.

With specific reference to FIG. 4 of the drawings, there is shown a flow chart of the process according to the present teachings. In a specific example of a logic analyzer that uses a sequencer according to the present teachings, there are N bits of incoming data 106 from the DUT 108 and the DUT clock 110 and six user specified pattern matches. The resource generator 123 compares each of the 8 de-multiplexed data states against the 6patterns matches to generate 6 compare results bits per data cycle. For 8 to 1 de-multiplexing 402, the resource generator 122, therefore, generates 6×8=48 bits of resource 124 for presentation to the sequencer 102. Each of eight sequencing elements 200 receives a 6-bit resource subset 124 a through 124h, respectively. The resource subsets 124a through 124h are presented 404 simultaneously to the respective sequencing elements 200a through 200h. The look up tables 201 through 204 in each sequencing element 200a through 200h determine 406 all possible next states 205 through 208 for each respective resource subset 124a through 124h. Each possible next state 205 through 208 are latched into sequencing registers 209-212 in each sequencing element 200a through 200h and are thereby made available at the input of the sequencer multiplexer 217. As the actual previous state 219 is made available from a previous sequencing element, the sequencer multiplexer 217 selects 408 one of the possible next states available at its input as the actual next state 218. As each actual next state 218 from a previous sequencing element 200 is communicated 410 to the next sequencing element 200, the sequencing multiplexers 217 make the appropriate actual next state selection and ripples the actual next state 218 as the actual previous state 219 through the sequencer 102. The actual next state 218 of the $8^{th}$ sequencing element 200h is latched into state latch 302 and is presented as the actual previous state 219 to the $1^{st}$ sequencing element 200a for use in the next resource cycle. The process of determining all possible next states, selecting an actual next state and communicating the actual next state 218 as the actual previous state 219 to the next sequencing element 200 repeats 412.

As part of the sequencer processing, a logic analyzer counter starts at some programmable value and may be decremented by any sequencing element 200a through 200h based upon a value of the resource subsets 124a through 124h. As an example, a logic analyzer may be programmed to trigger after some number of matches to a particular pattern or range. To perform such a function, the counter is loaded with a value and the value is decremented for each match until the counter reaches a terminal count at which time it performs the programmed function. When the counter reaches the terminal count, the sequencer 102 performs the action according to one programmed for the terminal count condition. To implement the counter in a sequencer embodiment according to the present teachings, each sequencing element 200 processes the counter for each respective resource subset. A logic analyzer counter is desirably of a significant width. The wider the counter, however, the more time required for counter processing. In a specific embodiment, the counter is a 24-bit element. In order to reduce the amount of circuitry and processing time to process the counter, the 24-bit counter is reduced to a 4-bit counter proxy that is used within each one of the sequencing elements 200. The counter proxy is established by reduction OR'ing the highest 21 bits of the counter as the $4^{th}$ bit, with the lowest 3 bits of the counter used as is. Because the sequencer 102 in a specific embodiment operates on 8 cycles of data within a single resource cycle, the 4-bit counter proxy is sufficient information to determine if the counter reaches terminal count within the 8 data cycles and to process through all sequencing elements 200 without losing counter coherency.

Figure 5:
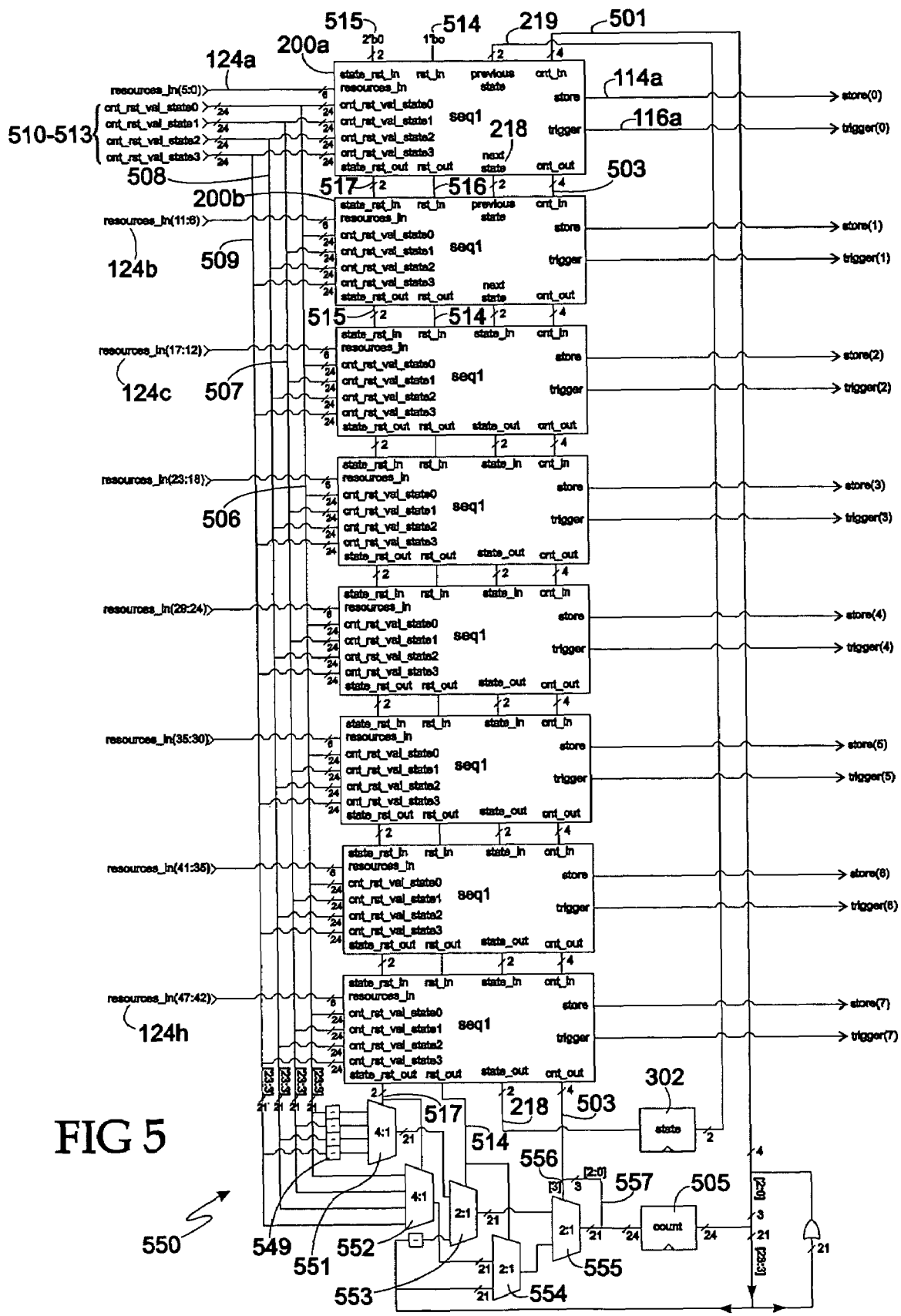
FIGS. 5 and 6 illustrate another embodiment of a sequencer and sequencing element respectively according to the present teachings.

With specific reference to FIG. 5 of the drawings, there is shown another embodiment of the sequencer 102 that includes circuitry for processing the counter and counter proxy. The counter proxy is processed by each sequencing element 200a through 200h as a straightforward 4-bit counter. After all eight sequencing elements 200 have processed the resources 124 and the counter proxy, counter clean-up circuitry 550 restores the coherency of the full 24-bit counter in preparation for processing the next resource cycle. During resource processing, there are certain conditions that cause the counter to be reset by the sequencing elements 200. As an example, the counter may be counting pattern or range matches in the data, but also is programmed to be reset if another pattern is found. In the event of a reset, the counter is loaded with a reset value. In a specific logic analyzer implementation, there are first, second, third and fourth 24-bit counter reset values 510, 511, 512, and 513, received by each sequencing element 200. In the event of a reset condition, the sequencing element 200 selects one of the counter reset values 510 through 513 depending upon a current state of the sequencer 102. A 4-bit previous counter proxy 501 is received by each sequencing element, for example 200b, from a previous sequencing element, for example 200a. Each sequencing element 200 calculates the next counter proxy 503 based upon the respective resource subset 124 and the previous counter proxy value 501. The next counter proxy 503 is presented as the previous counter proxy 501 to the next sequencing element 200. A counter register 505 stores the current counter value for presentation to the $1^{st}$ sequencing element 200a in the next resource cycle. Because the sequencing elements 200 process the counter proxy, there is counter clean-up circuitry disposed at the output of the $8^{th}$ sequencing element 200 for restoring the coherency of the 24-bit value maintained in the counter register 505. Accordingly, the counter register 505 maintains the correct counter value for each resource cycle.

A reset of the sequencer 102 based upon the resources 124 causes the counter to be reset. The counter may be reset to a different reset value depending upon a current state of the sequencer 102. Accordingly, in a 4-state sequencer, there are four respective counter reset values 510 through 513. A 1-bit reset and a 2-bit reset state are rippled through the eight sequencing elements 200 to maintain the reset information over the resource cycle for the counter clean-up circuitry-550. The beginning of the resource cycle has no reset, so logic "0"s are established as a first reset in 514a and reset state in 515a. As the signals are rippled through each sequencing element 200, each sequencing element 200 accepts the reset in 514 and reset state in 515 signals from the previous sequencing element 200. If no reset occurs within the sequencing element 200, the reset in 514 and state reset in 515 are passed through to the next sequencing element 200 unchanged as reset out 516 and state reset out 517. During a current resource cycle, a previous counter value 501 is decremented or not depending upon the resources 124a and is passed to the next sequencing element 200 as a next counter value 503, which is received by the next sequencing element 200 as the previous counter value 501. If a reset occurs as a result of the respective resource subset 124a through 124h, the sequencing element 200 sets the reset out 516 for presentation as the reset in 514 to the next sequencing element 200 indicating that a reset has occurred within the current resource cycle. In the event of a reset, the sequencing element 200 also sets the reset state out 517 indicating the state in which the reset occurred. The reset state out 517 is presented to the next sequencing element 200 as the reset state in 515. The sequencing element 200 further resets the counter proxy out 503 to an appropriate counter proxy reset value based upon one of the counter reset values 510 through 513 as determined by the sequencing element next state. After the reset state 517 and reset signals 514 are processed by all sequencing elements 200, the counter clean-up circuitry 550 restores the coherency of the counter value for the next resource cycle. Because the sequencing elements 200 treat the 4 bit counter proxy as a straightforward counter, the highest bit of the 4-bit counter proxy out 503 from the last sequencing element 200h is an indication of whether a borrow has occurred within the last resource cycle against the highest 21 bits of the counter for which the highest $4^{th}$ bit is a proxy. Specifically, a borrow on the highest bit of the 4 bit count proxy has occurred when the $4^{th}$ bit of the count proxy out 503 of the last sequencing element is a "0"). A zero value for the $4^{th}$ bit of the count proxy out 503 for the last sequencing element, therefore, indicates a decrement of the highest 21 bits of the counter in preparation for the next resource cycle. If no borrow is made on the highest bit of the 4 bit counter proxy out 503, i.e. when the value of the $4^{th}$ bit of the count proxy out is a "1", no decrement is indicated for the highest 21 bits of the counter. The counter clean up circuitry calculates the correct value of the upper 21 bits of the counter in the event of a reset by accepting the upper 21 bits of each counter reset value 510-513, decrementing 549 each value by one, and presenting the decremented values to a 4:1 first state counter multiplexer 551. The same upper 21 bits of each counter reset value are also presented un-decremented to 4:1 second state counter multiplexer 552. Selection of which of the four possible inputs into the decrement reset counter multiplexer 551 and the reset counter multiplexer 552 is made using the state reset out 517. Therefore, there are two possible upper 21 bits of the counter available at the output of the first and second state counter multiplexers 551, 552 representing the upper 21 bits of the counter if there were a reset and a borrow indicated by the proxy and if there were a reset but no borrow indicated by the proxy. Also pre-calculated in the counter clean up circuitry are the decremented and un-decremented values of the current counter. The decremented and un-decremented values of the current counter are presented as inputs to respective first and second reset multiplexers 553, 554. The other input to the first and second reset multiplexers 553, 554 is the output of the respective first and second state counter multiplexers 551, 552. Selection of which value is presented at the output of the first and second reset multiplexers 553, 554 is made based on the reset out 514 of the last sequencing element 200h. Accordingly, the outputs of the first and second reset multiplexers provide the correct upper 21 bits of the counter for the decremented and undecremented conditions having already processed any reset condition. The outputs of the first and second reset multiplexers 553, 554 are presented to borrow selection multiplexer 555. A proxy bit 556 of the counter proxy out 503 from the last sequencing element 200h provides selection of which of the inputs presented to the borrow selection multiplexer 555 is presented at its output. If the proxy bit 556 has a 0 value, a borrow has occurred at some point in the last resource cycle and the decremented selection of the correct upper 21 bits of the counter is made. If the proxy bit 556 has a 1 value, a borrow has not occurred and the undecremented selection of the correct upper 21 bits of the counter is made. The output of the borrow selection multiplexer 555, therefore, represents the correct upper 21 bits of the counter after reset and borrow processing. The output of the borrow selection multiplexer 555 is recombined with the lowest 3 bits of the count out 503 for storage in the counter register 505, which is latched at the next clock edge. Accordingly, a value in the counter register 505 reflects the correct counter value. The lowest 3 bits of the counter register 505 are then fed back as the lowest 3 bits of the previous counter proxy value 501 for the first sequencing element 200a in the next resource cycle. The upper 21 bits of the counter register 505 are reduction OR'd as the counter proxy bit of the previous counter proxy value 501 for the first sequencing element 200a in the next resource cycle. The upper 21 bits are also presented to the clean up circuitry 550 for use in counter processing in the next resource cycle.

Figure 6:
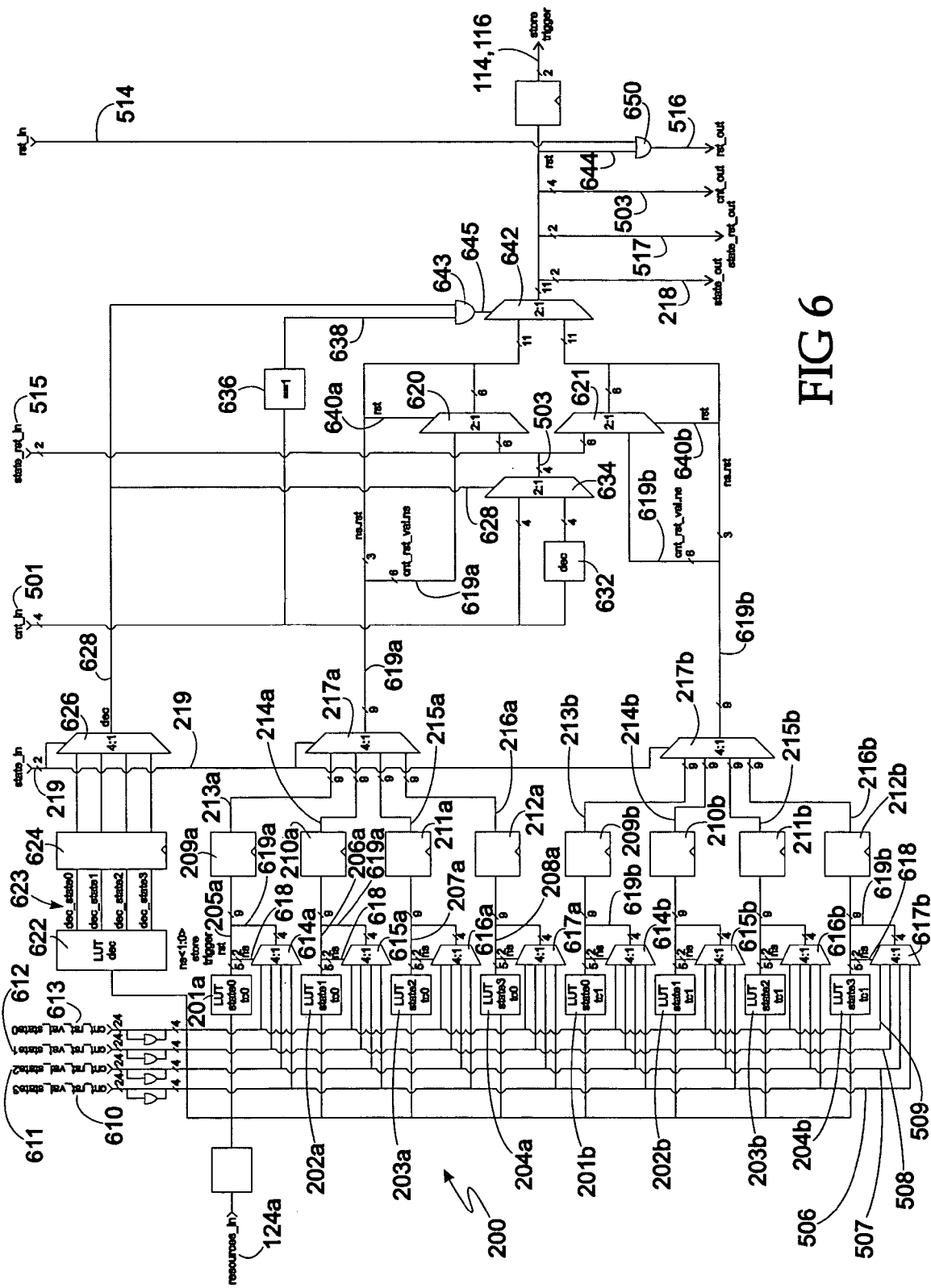

With specific reference to FIG. 6 of the drawings, there is shown an embodiment of a sequencing element 200 according to the present teachings. The embodiment of FIG. 6 is configured to implement the same 4-state state machine as shown in FIG. 3 of the drawings, but also to handle counter processing as discussed with respect to FIG. 5. In the embodiment of FIG. 6, there are first and second sets of the four look up tables in each sequencing element 200. A first set of look up tables 201a through 204a determine four possible next states 213a through 216a based upon the resources subset 124a when a terminal count condition is false. The second set of four look up tables 201b through 204b determine the four possible next states 213b through 216b based upon the resources subset 124a when a terminal count condition is true. Each set of look up tables 201a through 204a and 201b through 204b has respective sequencer multiplexers 217a and 217b associated with it. Each sequencer multiplexer 217a, 217b receives the actual previous state 219 to control selection of each sequencer multiplexer output. The embodiment of FIG. 6 also has a counter look up table 622 that accepts the same resource subset 124a as presented to the look up tables 201a through 204a and 201b through 204b. The counter look up table 622 determines four possible 1-bit decrement signals 623 indicating whether the counter is to be decremented or not based upon the resources subset 124a for each possible state. The four possible decrement signals 623 are stored into 4-bit decrement latch 624. Counter multiplexer 626 accepts the four possible decrement signals 623 and makes selection of the actual decrement signal 628 based upon the actual previous state 219. The previous counter proxy 501 is received by the sequencing element 200 from the previous sequencing element 200. The previous counter proxy 501 is checked against a value of 1 at counter compare 636. If the previous counter proxy 501 is equal to 1, the counter compare 636 presents a 1 at a counter compare output 638. If the previous counter proxy value is equal to anything except 1, the counter compare 636 presents a "0" at its output 638. The counter compare output 638 and actual decrement control signal 628 are inputs into 2-input AND terminal count gate 643. An output of the terminal count gate 640 provides a terminal count status 645 that indicates whether the counter is at its terminal count. If so, terminal count multiplexer 642 selects the output of sequencer multiplexer 217b related to a terminal count status of true. If not, the terminal count multiplexer 642 selects the output of sequencer multiplexer 217a related to a terminal count status of false.

As part of the counter processing in the sequencing element 200, the sequencing element 200 accepts the lowest 3 bits of each counter reset value 510 through 513 including a reduction OR'd result of the upper 21 bits as first through fourth counter reset proxies 610-613. Each look up table 210 through 204 has associated with it, a respective counter reset proxy multiplexer 614a through 617a and 614b through 617b. Selection of an appropriate possible counter reset proxy 619 for each possible state is made by a next state output 618 of each look up table 201a through 204a and 201b through 204b. The possible counter reset proxy value 619 is combined with the output of the respective look up table 201a through 204a and 201b through 204b, which includes 2 bits of next state information, store, trigger, and reset, for a total of 9 bits of information. Selection of an appropriate counter reset proxy for the terminal count false 619a and terminal count true 619b conditions is, therefore, made by the sequencing multiplexers 217a, 217b as part of the actual next state 218, store 114, trigger 116 and reset determination. The two possible counter reset proxies 619a, 619b as well as the two possible next states as calculated by the look up tables 201a-204a and 201b-204b are presented to first and second proxy/reset multiplexers 620, 621. The other input to the first and second proxy/reset multiplexers 620, 621 is the actual counter proxy 503. The actual counter proxy 503 is processed by the sequencing element 200 by accepting previous counter proxy value 501, decrementing it by one at reference numeral 632 and then presenting the decremented value to decrement multiplexer 634. The un-decremented counter proxy 501 is also presented to the decrement multiplexer 634. Selection between the decremented counter proxy value from 632 versus the un-decremented counter proxy value is made with actual decrement signal 628. As described above, selection between the decremented/un-decremented counter proxy and the counter reset proxy 619a, 619b for the terminal count-conditions of true and false is made by current reset 640a, 640b at first and second proxy/reset multiplexers 620, 621. The outputs of the first and second proxy/reset multiplexers 620, 621 provide the two possible counter proxies, store, trigger, next state., reset for the terminal count conditions of true and false. The two possible grouping are selected: using the terminal count multiplexer 642 to determine the actual counter proxy 503, store 114, trigger 116, actual next state 218 and current reset 644. The current reset 644 is conjunctively combined at reset AND gate 650 before presentation as the reset out 516.

Figure 7:
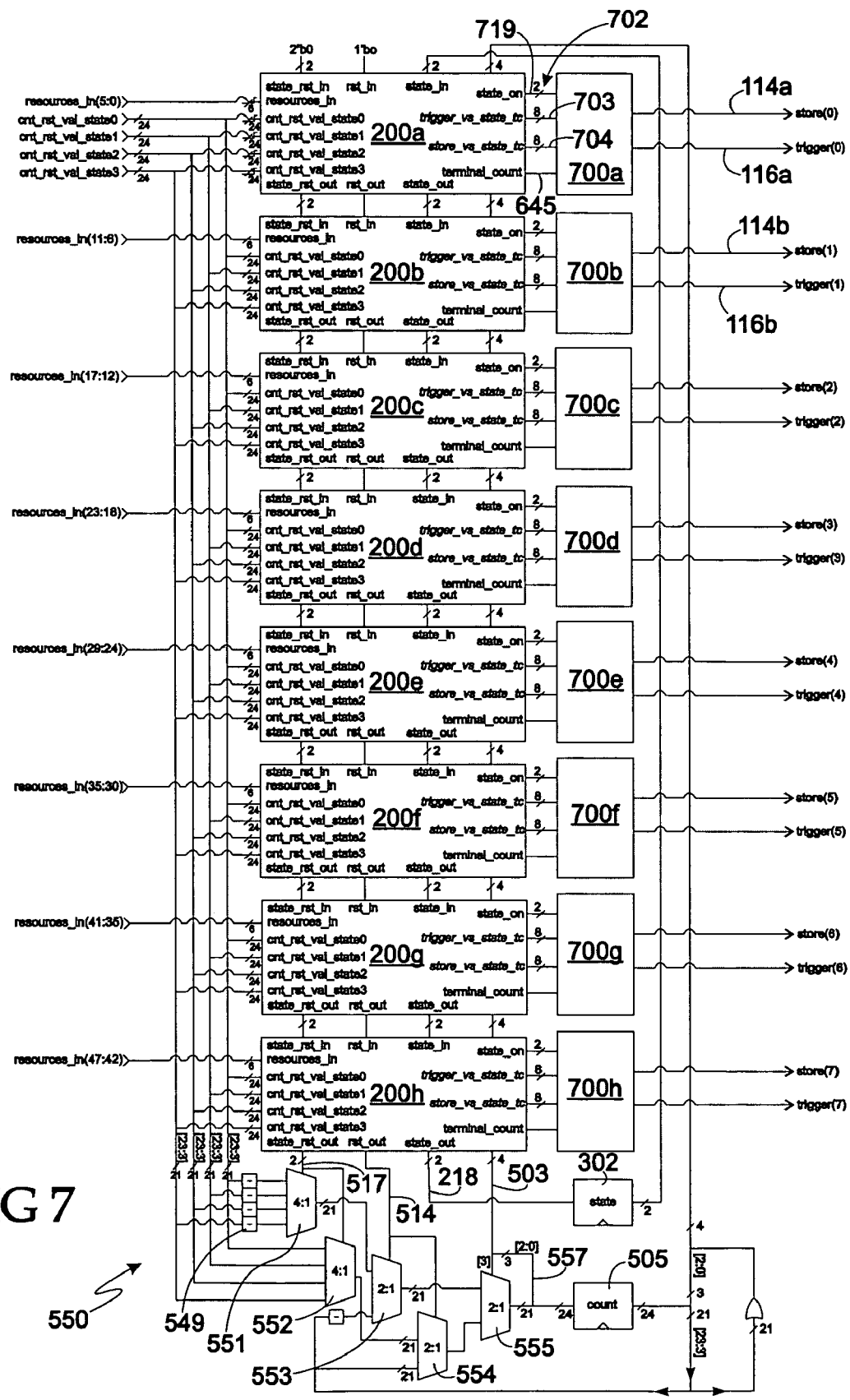
FIGS. 7, 8, and 9 illustrate another embodiment of a sequencer and sequencing element according to the present teachings.

With specific reference to FIG. 7 of the drawings, there is shown another embodiment of a sequencer 102 according to the present teachings wherein a determination of the store and trigger 114, 116 is removed from the next state, count and reset determinations and placed in a parallel functional block. In the embodiment of FIG. 7, there are primary and secondary sequencing elements 200, 700 that communicate across sequencing element interface 702. In an embodiment that uses 8:1 data to resource de-multiplexing, there are eight of the primary sequencing elements 200a through 200h communicating with eight of the secondary sequencing elements 700a through 700h over respective sequencing element interfaces 702a through 702h. Each sequencing element interface 702 comprises a state on 719, which is a latched value of the actual previous state 219, a store array 703 comprising the store signal for each possible next state for the terminal count true condition and the store signal for each possible state for the terminal count false condition, a trigger array 704 for each possible next state for the terminal count true condition and the trigger signal for each possible state for the terminal count false condition, and the terminal count status 645. The store and trigger arrays 703, 704 are 8-bits each. The secondary sequencing element 700a accepts the state on 719, the store and trigger arrays 703, 704 and terminal count 645 and determines the store 114 and trigger for each sequencing element 200/700. The inputs into each sequencing element and the counter clean-up circuitry are the same as shown and described in FIGS. 5 and 6.

Figure 8:
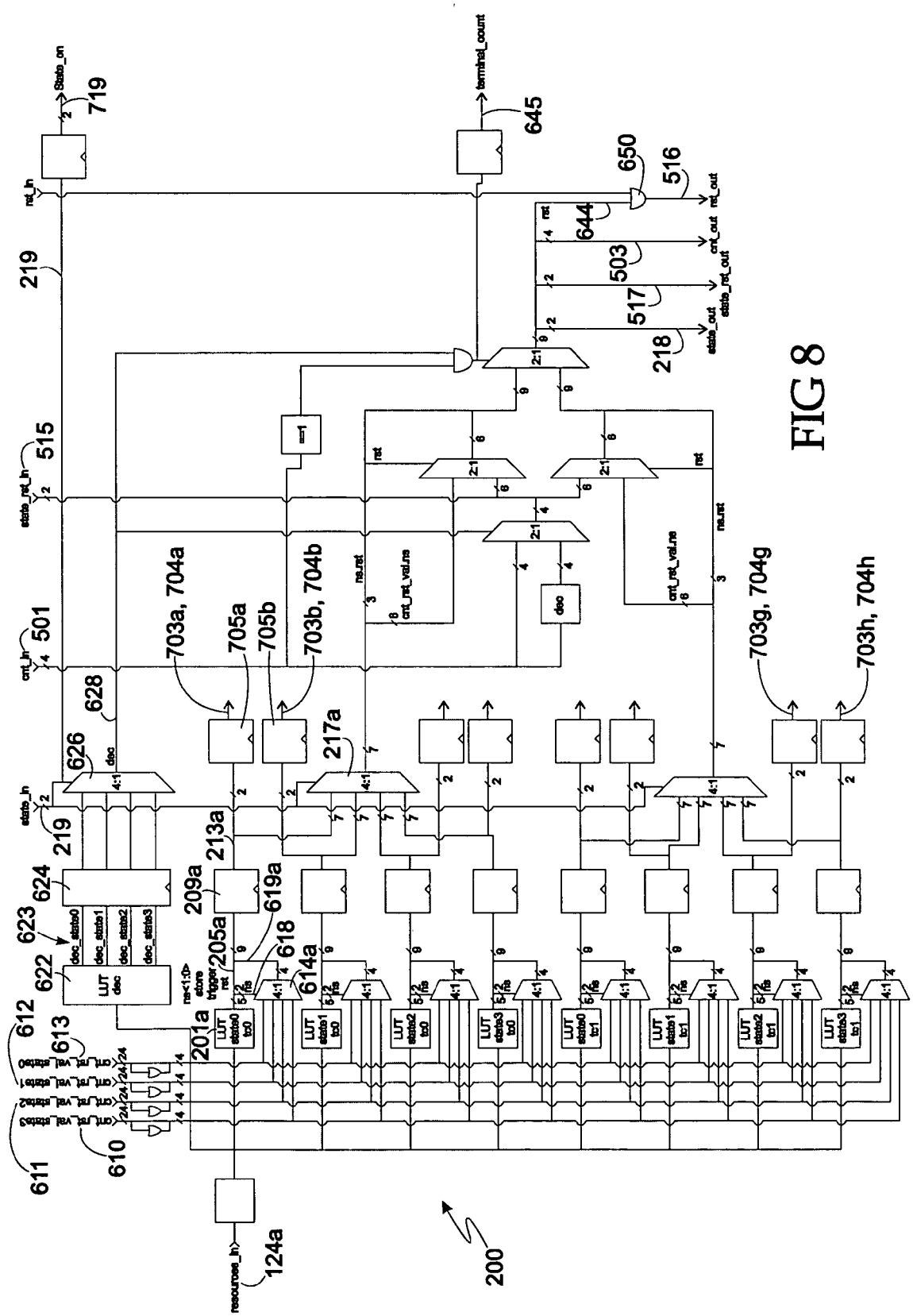

With specific reference to FIG. 8 of the drawings, there is shown an embodiment of the primary sequencing element 200 according to the present teachings-wherein an adaptation is made from the sequencing element of FIG. 6 by bringing out a possible store and trigger 703, 704 from each look up table output and latching it into a store/trigger memory element 705. Each look up table is related to a respective one of the store/trigger memory elements 703, 704. In a specific embodiment where there are two distinct sets of look up tables for true and false terminal count conditions, there are also possible store and trigger 703, 704 for both terminal count conditions. Accordingly, in the illustrated embodiment, look up table 201*a* is related to possible store bit 703*a* and possible trigger bit 704*a*, look up table 202*a* is related to possible store bit 703*b* and possible trigger bit 704*b* and look up table 204*b* is related to possible store bit 703*h* and possible trigger bit 704*h*.

Figure 9:
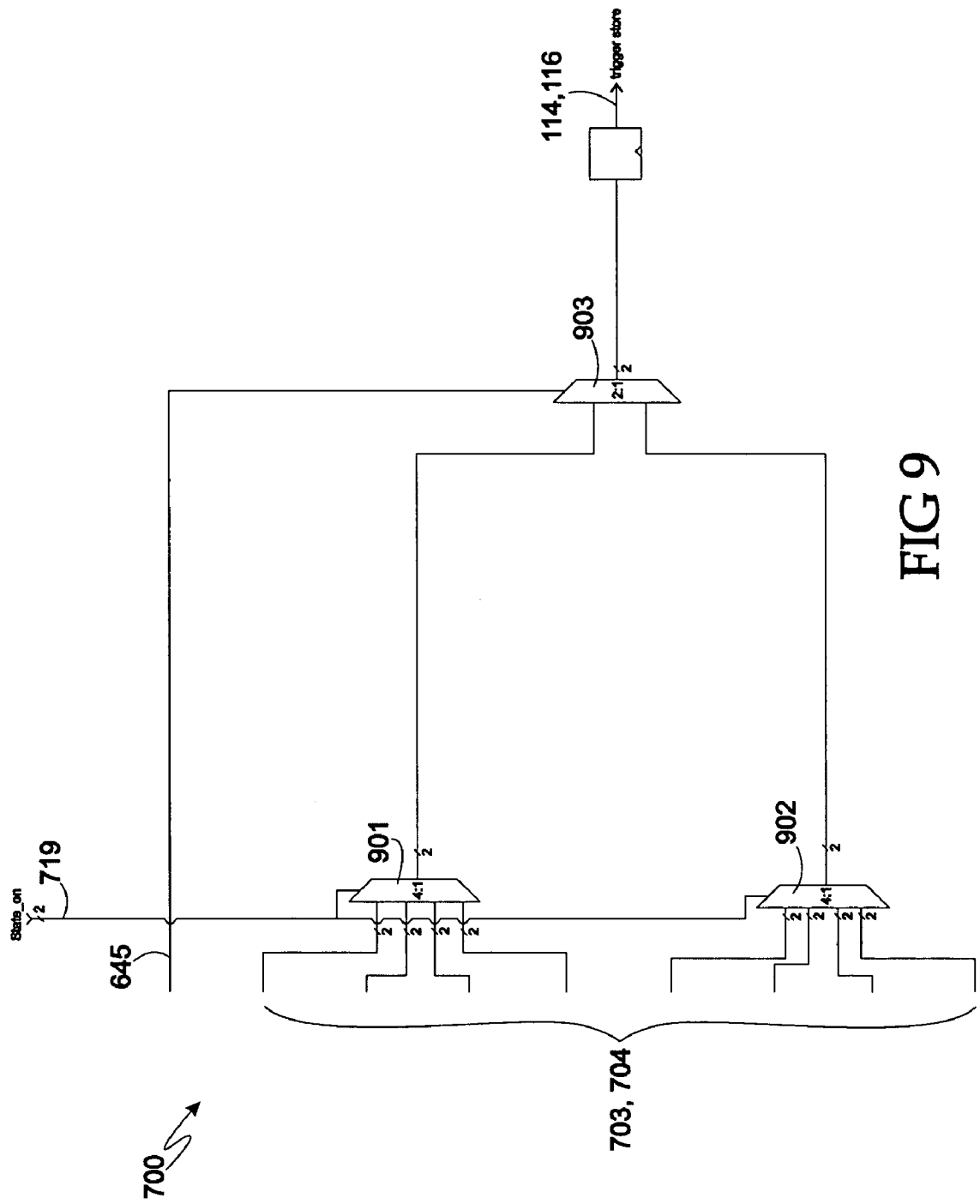

With specific reference to FIG. 9 of the drawings, the secondary sequencing element 700 performs final determination of the store 114 and trigger 116 for each primary sequencing element/secondary sequencing element 200/700 combination. Each secondary sequencing element 700 accepts the store 703 and trigger 704 arrays over the sequencing element interface 702. The possible store and trigger bits for a terminal count condition of false are presented to a first secondary sequencing element multiplexer 901. Similarly, the possible store and trigger bits for a terminal count condition of true are presented to a second secondary sequencing element multiplexer 902. Selection of an appropriate one of the possible store and trigger bits is made using the state on 719 signal for the terminal count false and true conditions. Determination of the final store 114 and trigger 116 is made by presentation of the appropriate store and trigger bits for the terminal count conditions of false and true to a tertiary secondary sequencing multiplexer 903 with selection made using the terminal count 645. An output of the tertiary secondary sequencing multiplexer 903 is the store/trigger 114, 116 for the primary and secondary sequencing element 200/700 combination.

Embodiments according to the present teachings are described herein by way of illustration. Other embodiments not specifically disclosed and within the scope of the appended claims will occur to one of ordinary skill with benefit of the present teachings. For example, as previously mentioned herein, the present teachings are applicable to many different de-multiplexing factors. De-multiplexing factors larger than 8 to 1 result in a larger circuit area to implement the circuit, however, they may produce better operating speeds. As the de-multiplexing factors increase, the circuit eventually suffers from too many layout parasitic impedances and operating speeds deteriorate. It is found that the 8 to 1 de-multiplexing is currently preferred in view of current technology. In another example of an alternate embodiment, the previous and next states may be represented with 4-bit one hot encoding as opposed to the disclosed 2-bit binary encoding. The 4-bit one hot encoding may result in an incremental increase in speed because the binary input multiplexers 217 that process the previous state information may be replaced with logic in each of the sequencing elements 200.

The invention claimed is:

1. A sequencer comprising:
at least two sequencing elements in cas0caded combination, each said sequencing element comprising a plurality of look up tables and a sequencer multiplexer, each look up table accepting resources and providing respective possible next states to said resources wherein each possible next state relates to a different previous state of said sequencer, and the sequencer multiplexer accepting said possible next states from the plurality of look up tables and presenting at a sequencer multiplexer output one of said possible next states as an actual next state of the sequencing element based upon an actual previous state,
wherein said actual next state of one of said sequencing elements is said actual previous state of another of said sequencing elements.

2. The sequencer as recited in claim 1 wherein said resources comprise de-multiplexed incoming digital data.

3. The sequencer as recited in claim 1 wherein there are N sequencing elements, wherein N is greater than 2, and said actual next state of said Nth sequencing element provides said actual previous state to another sequencing element.

4. The sequencer as recited in claim 1 wherein a quantity of said look up tables is equal to a number of possible states of said sequencer.

5. The sequencer as recited in claim 1 wherein each said sequencing element further comprises parallel sets of first and second ones of said look up tables, wherein said first look up table determines M number of said possible next states for a first possible condition and said second set of look up tables determines M number of said possible states for a second possible condition, wherein M is greater than 0, and further comprises a condition multiplexer for selecting a first or second sequencer output based upon a status of an actual condition.

6. The sequencer as recited in claim 1 wherein said sequencer multiplexer output further comprises at least one control signal for said logic analyzer functions.

7. The sequencer as recited in claim 1, further comprising:
an auxiliary look up table that operates in parallel with said sequencer for determining a condition command for each possible next state based upon said incoming data.

8. A sequencer comprising:
at least two sequencing elements in cascaded combination, each said sequencing element comprising a plurality of look up tables, each look up table accepting resources and providing respective possible next states to said resources wherein each possible next state relates to a different previous state of said sequencer, and a sequencer multiplexer accepting said possible next states and presenting at a sequencer multiplexer output one of said possible next states as an actual next state based upon an actual previous state,
wherein said actual next state of one of said sequencing elements is said actual previous state of another of said sequencing elements and wherein said sequencing elements comprise primary and secondary sequencing elements, wherein possible store and trigger bits from an output of said look up tables in said primary sequencing element are sent to said secondary sequencing element for final determination of store and trigger based upon said actual previous state of another of said sequencing elements.

9. The sequencer as recited in claim 8 wherein said final determination is further based on a terminal count condition.

10. The sequencer as recited in claim 8 wherein said final determination of said store and trigger is executed in parallel with said actual next state of respective ones of said primary sequencing elements.

11. A method for sequencing by sequencer comprising at least first and second sequencing elements, the method comprising;
   determining possible next states at a plurality of look up tables of the first sequencing element for respective possible previous states based upon resources received at the look up tables;
   selecting one of said possible next states as an actual next state of the first sequencing element based upon an actual previous state received from another sequencing element in the sequencer;
   communicating said actual next state as said actual previous state to the second sequencing element;
   determining possible next states at a plurality of look up tables of the second sequencing element for respective possible previous states based upon resources received at the look up tables; and
   selecting one of said possible next states as an actual next state of the second sequencing element based upon the actual previous state communicated from the first sequencing element,
   wherein said first sequencing element determines M number of said possible next states for a first condition and said second sequencing element determines M number of said possible states for a second possible condition, wherein M is greater than 0, and further comprising the step of selecting an output from said first and second sequencing elements based upon a status of a condition.

12. The method for sequencing as recited in claim 11 wherein there are at least first and second sequencing elements, wherein each sequencing element performs the steps of determining, selecting and communicating.

13. The method for sequencing as recited in claim 12 wherein there are N sequencing elements, where N is greater than 2, and wherein said actual next state of said Nth sequencing element provides said actual previous state for said first sequencing element.

14. The method for sequencing as recited in claim 11 wherein said step of determining further comprises the step of determining at least one control signal.

15. The method for sequencing as recited in claim 14 wherein said control signal initiates a storage function.

16. The method for sequencing as recited in claim 14 wherein said control signal initiates a trigger function.

17. The method for sequencing as recited in claim 11 wherein each sequencing element comprises a primary sequencing element and a secondary sequencing element and further comprising the step of determining possible store and trigger bits in the primary sequencing element and determining store and trigger in the secondary sequencing element.

18. The method for sequencing as recited in claim 17 and further comprising the step of communicating said possible store and trigger bits and said actual previous state to said secondary sequencing element.

19. The method for sequencing as recited in claim 17 wherein the step of determining further comprises the step of determining said possible store and trigger in the primary sequencing element for all states of said sequencer for a terminal count false condition and a terminal count true condition.

20. The method for sequencing as recited in claim 19 and further comprising the step of communicating said possible store and trigger bits, said actual previous state, and a terminal count status to said secondary sequencing element and said secondary sequencing element determining store and trigger based upon said actual previous state and said terminal count.

* * * * *

UNITED STATES PATENT AND TRADEMARK OFFICE
CERTIFICATE OF CORRECTION

PATENT NO. : 7,684,447 B2
APPLICATION NO. : 11/022252
DATED : March 23, 2010
INVENTOR(S) : Michael Rytting et al.

It is certified that error appears in the above-identified patent and that said Letters Patent is hereby corrected as shown below:

In column 10, line 3, in claim 1, delete "cas0caded" and insert -- cascaded --, therefor.

Signed and Sealed this

Eighteenth Day of May, 2010

David J. Kappos
*Director of the United States Patent and Trademark Office*